United States Patent [19]

Yamazaki et al.

[11] Patent Number: 5,089,426
[45] Date of Patent: Feb. 18, 1992

[54] METHOD FOR MANUFACTURING A SEMICONDUCTOR DEVICE FREE FROM ELECTRICAL SHORTAGE DUE TO PIN-HOLE FORMATION

[75] Inventors: Shunpei Yamazaki; Kunio Suzuki, both of Tokyo; Masato Susukida, Chiba; Mikio Kinka, Ishikawa; Takeshi Fukada, Kanagawa; Masayoshi Abe, Tokyo; Ippei Kobayashi, Hyougo; Katsuhiko Shibata, Shizuoka; Kaoru Koyanagi, Nagano; Susumu Nagayama, Kanagawa, all of Japan

[73] Assignee: Semiconductor Energy Laboratory Co., Ltd., Kanagawa, Japan

[21] Appl. No.: 464,567

[22] Filed: Jan. 16, 1990

Related U.S. Application Data

[63] Continuation-in-part of Ser. No. 287,660, Dec. 21, 1988, abandoned, which is a continuation of Ser. No. 909,202, Sep. 19, 1986, abandoned.

[30] Foreign Application Priority Data

| Sep. 21, 1985 | [JP] | Japan | 60-209595 |
| Sep. 21, 1985 | [JP] | Japan | 60-209596 |
| Nov. 6, 1985 | [JP] | Japan | 60-248640 |

[51] Int. Cl.⁵ ............... H01L 21/00; H01L 21/02; H01L 21/47
[52] U.S. Cl. ............................. 437/3; 437/2; 437/4; 437/189; 437/225; 437/228
[58] Field of Search .................. 437/2, 3, 4, 189, 225, 437/228; 148/33.2, 33.3

[56] References Cited

U.S. PATENT DOCUMENTS

| 3,290,567 | 12/1966 | Gowen | 357/59 |
| 4,542,255 | 9/1985 | Tanner et al. | 357/30 |
| 4,543,443 | 9/1985 | Moeller et al. | 357/30 |
| 4,584,427 | 4/1986 | Mackamul et al. | 437/189 |
| 4,586,241 | 5/1986 | Yamazaki | 437/2 |
| 4,624,737 | 11/1986 | Shimbo | 357/4 |
| 4,642,144 | 2/1987 | Tiedje et al. | 357/4 |
| 4,725,558 | 2/1988 | Yamazaki | 437/2 |
| 4,749,454 | 6/1988 | Arya et al. | 437/4 |
| 4,764,476 | 8/1988 | Yamazaki | 437/4 |
| 4,786,607 | 11/1988 | Yamazaki | 437/2 |
| 4,812,415 | 3/1989 | Yamazaki | 437/2 |
| 4,937,651 | 6/1990 | Yamazaki | 357/52 |

FOREIGN PATENT DOCUMENTS

| 0060746 | 1/1965 | Australia. | |
| 0081566 | 3/1982 | Australia. | |
| 59-54270 | 3/1984 | Japan | 357/30 |
| 0054270 | 3/1984 | Japan | 357/30 |

OTHER PUBLICATIONS

Chaudhari, Annealing to fill cracks in thin films, IBM Tech. Discl. Bull., vol. 15, No. 9, Feb. 1973, p. 2697.

*Primary Examiner*—Brian E. Hearn
*Assistant Examiner*—B. Everhart
*Attorney, Agent, or Firm*—Sixbey, Friedman, Leedom & Ferguson

[57] ABSTRACT

An improved semiconductor device is disclosed which is free from current leakage due to pin-holes or other gaps. Also an improved method for provessing a semiconductor device is shown. According to the invention, gaps produced in fabricating process of the semiconductor layer are filled with insulator in advance of deposition of electrodes. By virtue of this configuration, short current paths do not result even if transparent electrode is provided on the semiconductor layer.

3 Claims, 7 Drawing Sheets

METHOD FOR MANUFACTURING A SEMICONDUCTOR DEVICE FREE FROM ELECTRICAL SHORTAGE DUE TO PIN-HOLE FORMATION

This application is a continuation-in-part of Ser. No. 07/287,660, filed Dec. 21, 1988, which was a continuation of application Ser. No. 06/909,202, filed Sept. 19, 1986, now abandoned.

BACKGROUND OF THE INVENTION

This invention relates to a semiconductor device and a method for manufacturing same in which the performance of the semiconductor device is improved. More particularly, this invention relates to measures for eliminating disadvantages caused by the effect of electrical shorts and shunts due to pinholes or other gaps created during the fabrication process of the device.

Recently, considerable efforts have been made to develop systems for depositing amorphous semiconductor alloys, each of which can encompass relatively large areas, and which can be doped to form p-type and n-type materials for the production of p-i-n and other type devices which are, in photovoltaic and other applications, substantially equivalent to their crystalline counterparts. As such devices, the applicant disclosed improved photoelectric cells in Japanese Patent Published Applications Nos. sho 55-4994, 55-124274, 56-13777, 56-13778 and 56-13779.

Figure 1:
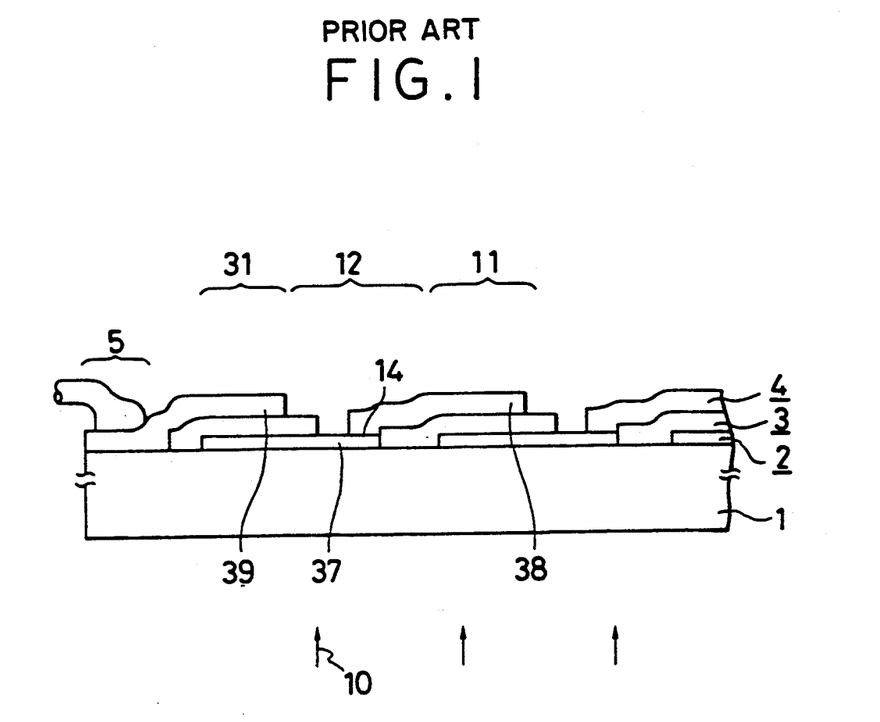
FIG. 1 is a fragmentary, cross-sectional view of a prior art solar cell.

One example of a prior art photovoltaic device is shown in FIG. 1. In the figure, a transparent conductive film 2 is formed on a glass substrate 1 with a mask aligned above the substrate 1. Semiconductor layers 3 are deposited on the substrate 1 with the conductive film 2 therebetween with a mask aligned above the substrate 1. Further, on the substrate 1 with the conductive film 2 and the semiconductor layers 3, aluminum layers 4 are formed as second electrodes with the aid of a mask. Reference numerals 31 and 11 designate respective photoelectric cells in the figure.

The two cells 31 and 11 are connected in series by means of a connection 12. In the connection 12 the second electrode 38 is made in contact with the first electrode 37. Upper electrode 39 is connected to external connection 5. Although the figure appears only with two connections, a number of the cells ar connected with each other in degraded after thermal treatment at 150° C. for tens of hours. Such device is not suitable for outdoor use where the device is likely subjected to high temperature ambience.

To eliminate the adverse reaction, use is made of a double-layered electrode as the second electrode composed of a conductive transparent layer such as an ITO (Indium-Tin-Oxide) film below the aluminum electrode, the ITO film being free from reaction with the aluminum layer or the semiconductor layer. The conductive transparent electrode, however, tends to be finely deposited throughout the semiconductor including pinholes, gaps, or the like defects during fabrication processing. The transparent electrode in the defects constitutes short current paths either as it is or under some influence after fabrication. Because of this, only photovoltaic devices having a narrow converting area such as of 1 cm × 4 cm are currently available.

One attempt to eliminate short current circuit paths within amorphous semiconductor photovoltaic devices involves the application of a reverse bias to the device. The applied reverse bias causes large currents to flow through the short circuit current paths causing localized heating of the current paths. The localized heating crystallizes the amorphous semiconductor in the region of the short circuit current paths to increase the resistivity of the paths. Unfortunately, this process has many limitations. The resistivity of the path remains less than the resistivity of the unheated amorphous semiconductor device area although certainly increased by the concentrated current. As a result, the short circuit current paths are not eliminated, but have their resistivity changed to a limited extent. Also this method is not effective for eliminating short circuit current paths resulting from substrate surface irregularities which can be a most prevalent cause of short circuit current paths, especially in large area devices having a roughened substrate surface forming a diffusing back reflector.

SUMMARY OF THE INVENTION

It is therefore an object of the invention to provide an improved semiconductor device and a method for fabricating same in which adverse short circuits are effectively eliminated.

It is another object of the invention to provide an improved semiconductor device and a method for fabricating same in which undesirable shunts are eliminated with only simple procedures.

It is further object of the invention to provide an improved semiconductor device which can be designed with an effective roughened large area and without causing short circuit current paths.

DETAILED DESCRIPTION OF THE PREFERRED EMBODIMENTS

Referring to FIGS. 2(A) through 2(D), an embodiment of the invention is shown.

Figure 2A:
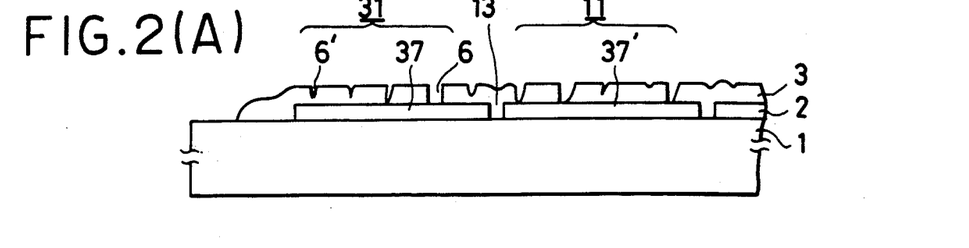
FIGS. 2(A) through 2(D) are fragmentary, cross-sectional views showing the manufacturing process of an embodiment of the invention.

In the figure, a transparent electrode 2 is formed and patterned on transparent substrate 1 made of, for example, a glass pane 1.2 mm thick × 10 cm long × 10 cm wide. The transparent electrode 2 is made, inter alia, from an ITO layer 1500 angstroms thick superimposed by a $SnO_2$ layer 200 to 400 angstroms thick, an ITO layer 1500 angstroms thick superimposed with a $Sn_3N_4$ layer 500 angstroms thick, or a transparent layer doped with halogen of 1500 through 2000 angstroms thickness mainly made of tin oxide or tin nitride by a CVD method in vacuum, an LPCVD method, a spraying method, or a sputtering method.

The layers thus laminated are irradiated from the upper or lower side of the substrate 1 with a laser beam of 1.06 micrometers wavelength or 0.53 micrometer wavelength from a YAG laser to perform the patterning of the transparent electrode 2. The grooves 13 of 10 cm length formed by the patterning partition adjacent cells, each groove having 10 to 20 mm width. On the layer 2 is formed, by a plasma or photo CVD method, a non-single-crystal layer 3 of 0.2 to 1.0 micrometer thickness having a p-n or p-i-n junction, normally of 0.5 to 0.7 micrometer thickness. For instance, the non-single-crystal layer can be comprised, with a p-i-n junction, of a p-type semiconductor layer ($Si_xC_{1-x}$; where $1>x>0$) 50 to 150 angstroms thick, an intrinsic amorphous or intrinsic semiamorphous silicon semiconductor layer 0.4 to 0.9 micrometer thick, and a crystalline semiconductor layer 200 to 500 angstroms thick.

On the semiconductor layer 3, a plurality of gaps and pinholes 6 and 6' result unintentionally due to falling out of flakes (i.e. during deposition of a semiconductor layer, deposition occurs not only on the substrate, but also unintentionally upon walls or electrodes of the reaction chamber, and the unintentionally formed deposits tend to fall of flake onto the substrate surface causing pin holes in the semiconductor layer) which are incorporated into the semiconductor layer 3 during fabrication. There are observed about two to four such defects in ten fields of views through a microscope with a magnification of 100 to 1000.

According to the invention, the holes 6 and 6' are filled and stopped with insulator. Hereinbelow, the stopping process will be explained in detail.

The semiconductor layer 3 with the holes 6 and 6' is coated with photocurable organic resin by a spinner or a coater in such a manner that all the holes are filled completely with the resin 7 and 7'. The organic resin may be "Photoneeth" distributed from Toray Industries Inc., or other known photo resist. For instance, an amount of Photoneeth having a viscosity of about 120 CP is applied on the layer 3 in a 0.2 through 5.0 micrometers thickness by spinning at 500 rpm for 10 seconds and thereafter at 2000 rpm for 30 seconds, followed by a prebaking at 85° C. for an hour. The semiconductor layer 3 is irradiated from the glass substrate side with ultraviolet light 17 having 300 to 400 nanometers wavelength. The ultraviolet light cannot penetrate the semiconductor layer 3 because of the absorption in the layer whereas the resin stopping the holes 6 and 6' is selectively cured. In other words, the intensity and the wavelength are chosen so that the semiconductor layer 3 can function as a mask. The remaining resin cured in the holes is chemically stabilized by sintering and postcuring. Thus the stopping process is completed.

Figure 2B:
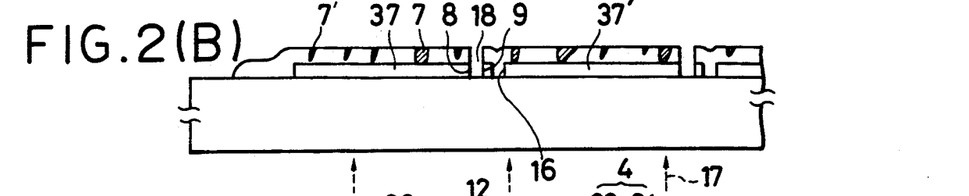

After stopping the holes, openings 18 are formed adjacent to the groove 13 as shown in FIG. 2(B) by means of laser scribing to provide an access to the first electrodes 37 and 37' via side contacts 8 and 9. Although the openings 18 reach the substrate 1 in the figure, they can be more shallow as long as the first electrodes 37 and 37' are exposed by the opening. Undesired residue remains after the formation of openings 18 by the laser scribing process. This residue is removed by etching with an acid such as hydrochloric acid or HF. The etchant is then rinsed with a rinse such as pure water. Since holes 18 are stopped previous to the etching step, etchant does not get caught in the holes or defects and thus the rinse can effectively remove the etchant. That is, if the holes were not stopped, the etchant tends to get caught in the detects and can not be removed by the rinse due to the small size of the defects. A second electrode 4 consisting of two conductive layers 23 and 24 is deposited on the laminated layers and separated by laser scribing into portions by grooves 20.

Figure 2C:
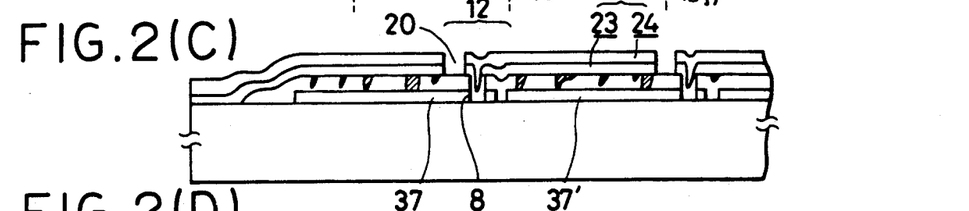

The lower conductive layer 23 may be 300 to 1400 angstroms thick and made from ITO, $In_2O_3$, $SnO_2$, or ITN (a mixture of indium nitride and tin nitride). The upper conductive layer 24 may be 300 to 500 angstroms thick and made, as a single or double layer, from aluminum, chromium or silver. For example, the second electrode 4 may be composed of an aluminum layer 1000 angstroms thick on an ITO layer 1500 angstroms thick. The aluminum layers 24 form inside surfaces from which incident light 10 entering from the substrate side can be reflected. The ITO layers 23 are disposed to prevent the aluminum later from corroding due to interaction with the semiconductor layer. These two layers are fabricated by an electron beam deposition or a plasma CVD method at less than 300° C. As a result, an improved solar cell is provided with which light having a wavelength of 600 to 800 nm can be efficiently converted into electricity.

For contact with an n-type semiconductor, a transparent indium compound or mixture including indium oxide and/or indium nitride is considered adequate as the transparent layer 23. For a p-type semiconductor, a tin compound or mixture of $SnO_2$, $Sn_3N_4$ and/or $SbN$ is adequate in view of its high efficiency and long term reliability.

The transparent electrode 23 is formed in contact with the first electrode 2 at the opening 18. At this contact there is only a hetero- or homo- junction of a nitride and/or an oxide so that no interaction occurs even at 150° C., unlike the prior art illustrated in FIG. 1. In addition to this, such a laminated electrode 4 is advantageous especially for laser patterning. Namely, the aluminum electrode 24 can be removed during the laser patterning together with the transparent electrode 23 which is easily sublimated under irradiation of laser beam and carries the aluminum electrode thereon away from the substrate.

Figure 2D:
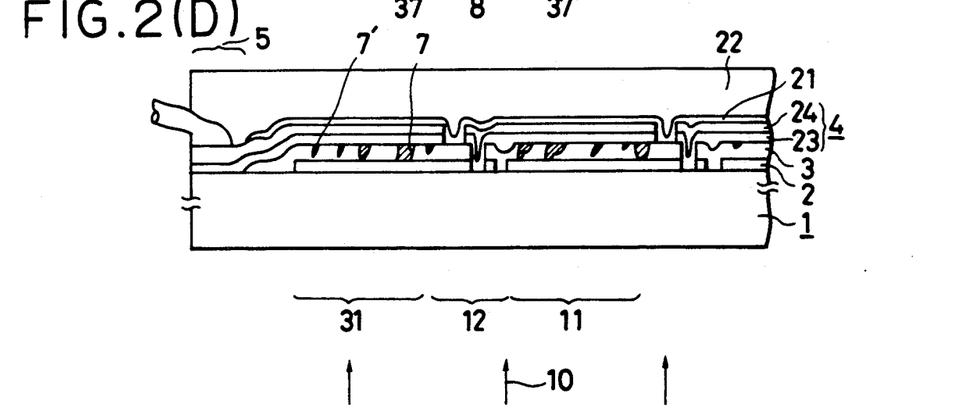

A passivation film of silicon nitride 21 is then deposited to 500 to 2000 angstroms thickness by a photo CVD method or plasma vapor deposition; and an output terminal 5 is provided on the aluminum electrode 24. Thus, following placement of an organic resin encapsulating layer 22 comprising such as polyimide, polyamide, kapton or epoxy, the semiconductor device is made into a photoelectric conversion device in which a plurality of cells 31 and 11 are connected in series by the connection 12.

The organic resin layer 22 is provided mainly for fixation of the output electrode 5. Further, a device of 120×40 cm, two devices of 60 cm×40 cm, or six devices of 40 cm×20 cm are integrally packaged into a 120 cm×40 cm panel according to NEDO (New Energy Development Organization) standard.

Experimental results obtained with a solar cell manufactured according to the above described process and having a substrate of 10 cm long × 10 cm wide are given below:

open-circuit voltage: 12.77 V
fill factor: 0.574
short-circuit current: 69.0 mA
conversion efficiency: 7.46%

Also, experimental results obtained with a solar cell which is manufactured without the stopping process, with other processing being similar to the above, are given below:

|  | sample 1 | sample 2 |
|---|---|---|
| open-circuit voltage | 11.49 V | 3.02 V |
| fill factor | 0.471 | 0.316 |
| short-circuit current | 53.7 mA | 54.20 mA |
| conversion efficiency | 4.43% | 0.75% |

From the above data, it is seen that the hole stopping process makes the solar cells more efficient.

Figure 3:
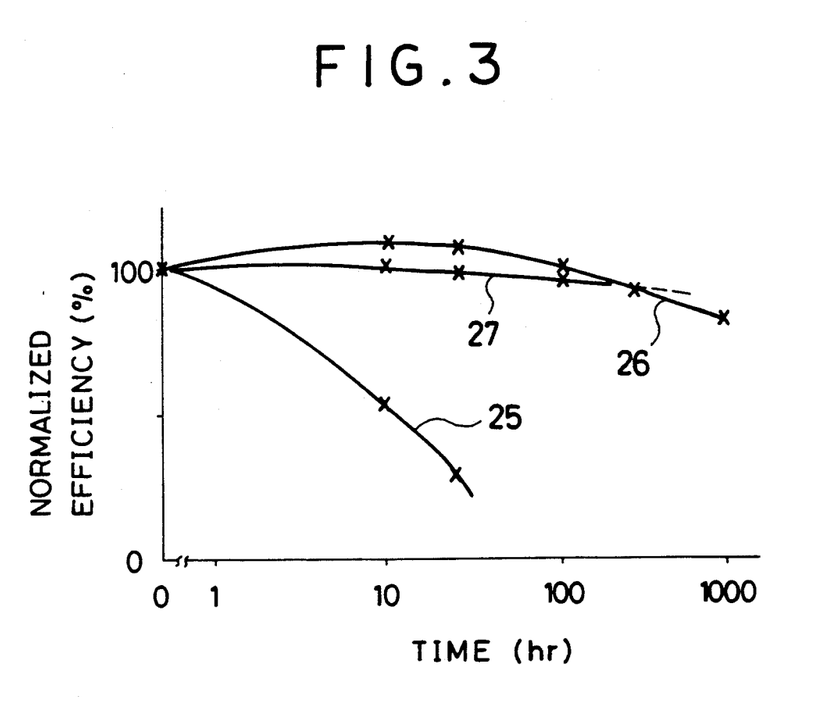
FIG. 3 is a graphical diagram showing the relation between time and photoelectric conversion efficiency.

FIG. 3 shows the variation of normalized efficiencies with the passage of time obtained by reliability trials of solar cells according to the prior art and the invention under atmospheric conditions but at 150° C. Curve 25 shows the normalized efficiency of the prior art device having the configuration of FIG. 1; the efficiency is degraded with time. In the prior art device, the aluminum electrode 4 is made in contact with the semiconductor layer 3 and in the contact 12 tin oxide layer 37 is in contact with the aluminum electrode 4. These contacts give rise to oxidation of the aluminum electrode 4 and to interaction between the electrode 4 and the semiconductor layer 3 of n-type. Because of this, the efficiency is degraded to less than 50% of the initial value after only ten hours.

On the other hand, curve 26 is plotted for the embodiment of the invention provided with resin stopping the holes and the two-layer laminated electrode 4. In this configuration only oxide-oxide contracts occur, making the contact 12 stable and reliable. The other important feature of the invention is not illustrated in the figure, namely that high yield can be obtained since the fluctuation of the characteristics among products is small. For instance, 0.27 was obtained as the variance of efficiency from ten samples 10 cm long × 10 cm wide.

Referring to FIGS. 4(A) to 4(D), another embodiment of the invention is illustrated. On a substrate 1 such as a glass pane 1.2 mm thick × 10 cm long × 10 cm wide is film of an ITO layer 1500 angstroms thick on a $SnO_2$ layer 200 to 400 angstroms thick or a transparent film mainly composed of tin oxide or tin nitride doped with halogen. The film may be fabricated by an LPCVD method, a plasma CVD method, a spraying method, a sputtering method, or an ECR method.

Figure 4A:
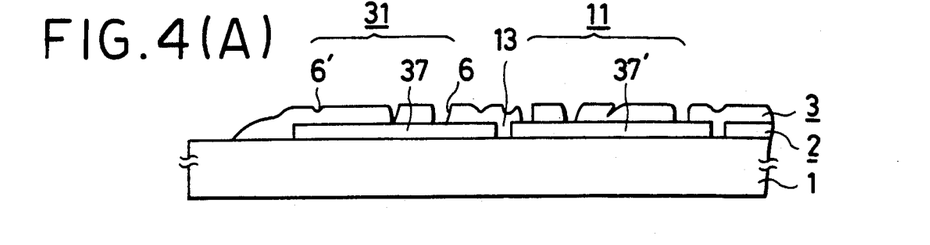
FIGS. 4(A) through 4(D) are fragmentary, cross-sectional views showing another embodiment of the invention.

The conductive film 2 is divided into a plurality of sections by patterned grooves 13 which are formed by a laser beam of 1.06 micrometers wavelength or 0.53 micrometers wavelength from a YAG laser controlled by a microcomputer.

The patterned grooves are 50 micrometers wide and 10 cm long by which each section of 10 to 20 mm width partitioned from the others. On this film a nonmonocrystal semiconductor layer 3 of 0.2 to 1.0 micrometer thickness, more preferably 0.5 to 0.7 micrometer thickness, is formed with a p-n or p-i-n junction. A preferred example is a laminated layer composed of a p-type semiconductor layer ($Si_xC_{1-x}$; where $1>x>0$) 50 to 150 angstroms thick, an intrinsic amorphous or intrinsic semiamorphous silicon semiconductor layer 0.4 to 0.9 micrometer thick, and a crystalline layer 200 to 500 angstroms thick.

The semiconductor layer 3 with the holes 6 and 6' is coated by a spinner or coater with photocurable organic resin in such a manner that all the holes are completely filled with the resin. The organic resin may be a photoresist of positive type such as OFPR-800 distributed by Tokyo Ohka Kogyo Co., Ltd., or other known photoresist. For instance, an amount of photoresist 7 is applied on the layer 3 to a thickness of 0.1 through 5.0 micrometers by spinning at 500 rpm for 5 seconds and thereafter at 2000 rpm for an hour followed by prebaking at 85° C. for 40 minutes. The semiconductor layer 3 is irradiated from the photoresist side with ultraviolet light 17 having 300 to 400 nanometers wavelength. The fixing of the OFPR-800 is effected by irradiation of ultraviolet light of 6 $mW/cm^2$ for 5 seconds, followed by aftertreatments. Then, the unfixed resin is eliminated by a known rinsing with pure water for 10 minutes. The remaining fixed resin in the holes 6 and 6' is chemically stabilized by sinter and post-cure treatments. For instance, the layer is given a post baking for an hour at 150° C. Thus the stopping process is completed.

Figure 4B:
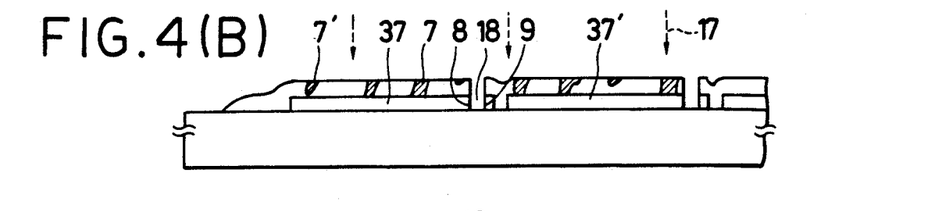

After stopping the holes, openings 18 are formed adjacent to the grooves 13 as shown in FIG. 4(B) by means of laser scribing to provide an access to the first electrodes 37 and 37'. Although the openings 18 reach the substrate 1 in the figure, they can be more shallow as long as the first electrodes 37 and 37' are exposed by the grooves 13. Undesired residue remains after the formation of openings 18 by the laser scribing process. This residue is removed by etching with an acid such as hydrochloric acid or HF. The etchant is then rinsed with a rinse such as pure water. Since holes 18 are stopped previous to the etching step, etchant does not get caught in the holes or defects and thus the rinse can effectively remove the etchant. That is, if the holes were not stopped, the etchant tends to get caught in the detects and can not be removed by the rinse due to the small size of the defects. A second electrode 4 which may consist of two conductive layers is deposited on the laminated layers and separated into portions by grooves 20 formed by laser scribing.

Figure 4C:
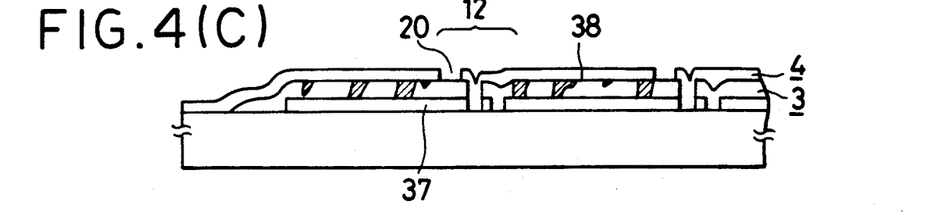

The second electrode may be a transparent conductive layer 300 to 500 angstroms thick, for example, made of ITO, $In_2O_3$, $SnO_2$ or ZnO through which incident light can go out of the device.

On the other hand, the second electrode may be formed reflective by deposition, on the transparent electrode, of aluminum, chromium, or silver as a single-layered reflective film, or aluminum and nickel as a double-layered reflective film. In this embodiment, the second electrode is comprised of an ITO layer 1050 angstroms thick and an aluminum layer 1000 angstroms thick. The electrode can be formed by sputtering, an electron beam deposition, or plasma CVD method at less than 300° C. in order not to degrade the semiconductor.

Figure 4D:
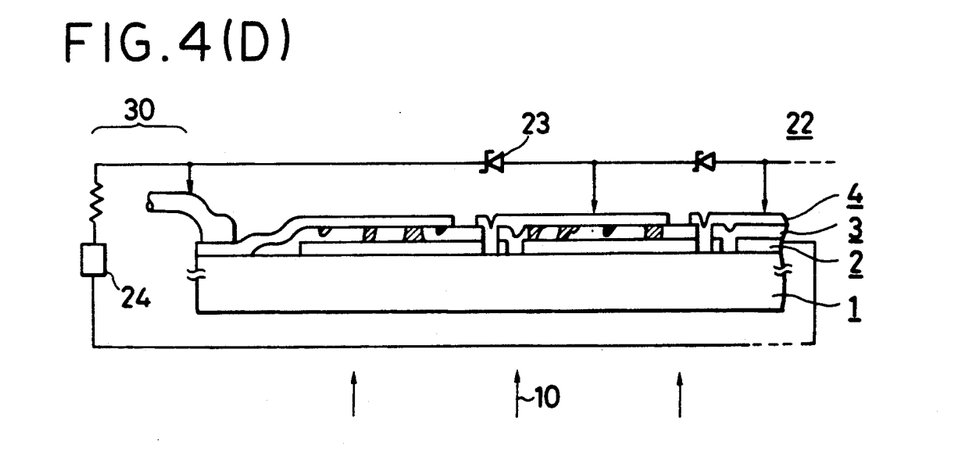
Figure 5:
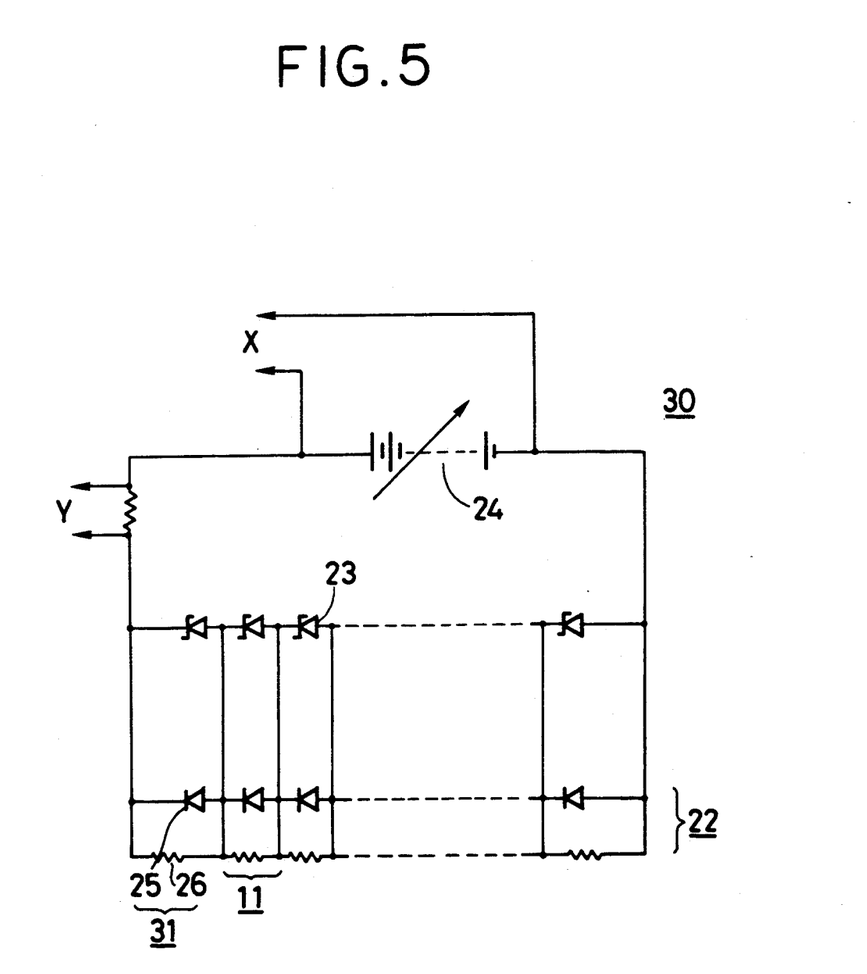
FIG. 5 is an equivalent circuit of another embodiment of the invention.

Referring to FIG. 4(D) and FIG. 5, a reverse bias applying circuit is illustrated. The circuit comprises a power supply 24' and a number of zener diodes 23'. Between each adjacent pair of diodes 23' and between the power supply and the first or last diodes contact is made with the first and second electrodes respectively so that the output voltage is divided into the reverse bias voltage which is applied to each cell constituting the device. The reverse bias voltage must be less than the breakdown voltage of the p-i-n junction of the semiconductor layer 3. Because of this the reverse bias voltage does not cause current to pass through flawless portions of the semiconductor layer 2. To preclude breakdown of the p-i-n junction further, the zener diodes are selected out of a variety of candidates for voltage dividing elements. The zener voltage is chosen slightly below the breakdown voltage of the p-i-n junction.

In FIG. 5, the circuit diagram includes the number of cells constituting the device, each of which is represented by a diode 25' corresponding to the semiconductor layer 2 and a resistance 26 corresponding to the defects (holes) as leakage source. The zener diode 23' is connected in parallel to the diode and the resistance so that the voltage applied to the diode 25' is kept below the breakdown voltage thereof.

With the bias voltage less than the breakdown voltage, the holes or flaws in the semiconductor layer 3 filled with the organic resin become current passages which are heated as electric current flows therethrough. The electric power is sometimes short of that required for completely burning out the holes or flaws. To make the burning out easy, the substrate 1 is heated in advance together with the semiconductor to a temperature less than that at which the semiconductor may be degraded, normally less than 150° C.

Figure 6:
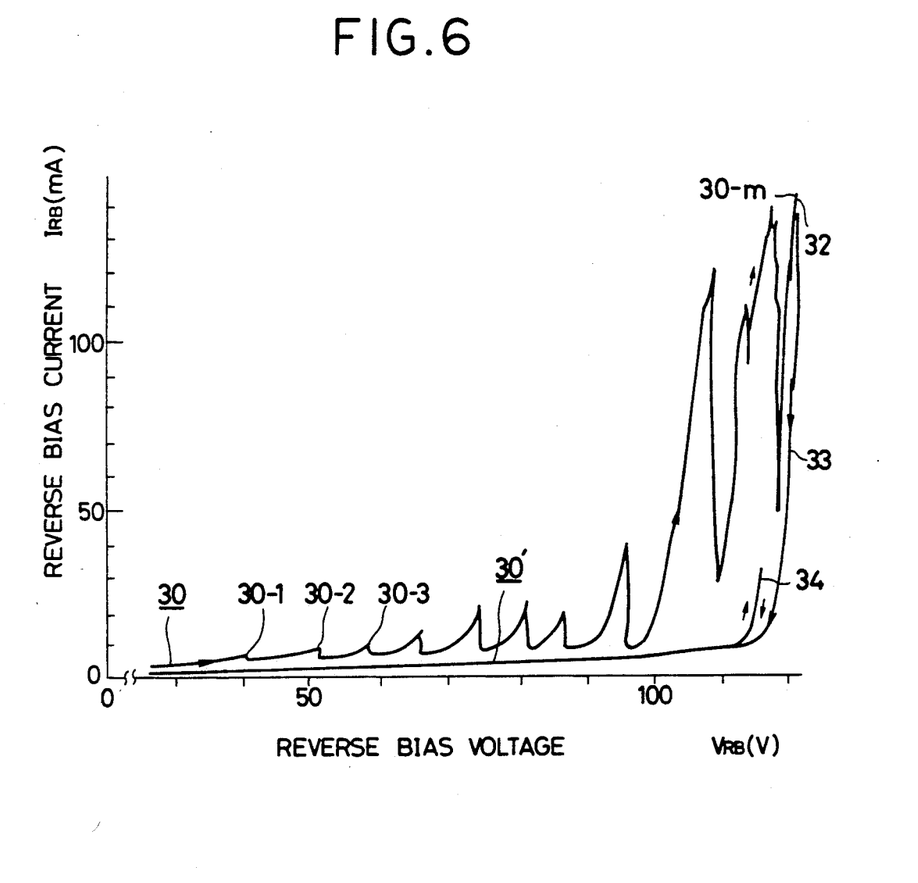
FIG. 6 is a graphical diagram showing the trend of reverse bias current in response to increasing reverse bias voltage.

An experiment was made with a device having 15 cells connected with each other and the bias voltage set at 120 V. As a result, the current trend in response to increasing reverse bias voltage was obtained as shown in FIG. 6.

In the experiment, the reverse bias voltage increased from 0 V to 120 V. A first leakage current was observed at 30-1. However, the leakage current was cured because of burning out due to the concentrated current flow. As the reverse bias voltage increased, a number of current ripples were observed. The magnitude of the leakage current became larger at the higher reverse bias voltages. With the reverse bias voltage decreasing from a point 32, the reverse bias current smoothly dropped without leakage current.

For reference, the device thus treated was subjected to increasing reverse bias voltage. No leakage current, however, was observed until the reverse current increased at the breakdown voltage.

After removing the bias applying circuit, the device integrated on a 10 cm × 10 cm panel was irradiated with light of 100 mW/cm$^2$ (AM1). The characteristics obtained are:
  open-circuit voltage: 12.943 V
  fill factor: 0.9941
  short-circuit current: 79.34 mA
  current density: 17.290 mA/cm$^2$
  efficiency: 9.90%

With the device fabricated according to the process identical to that shown in FIG. 4 but without reverse bias curing, the following experimental data 1 were obtained, and without the stopping process and reverse bias curing, the following experimental data 2 were obtained:

|  | data 1 | data 2 |
| --- | --- | --- |
| open-circuit voltage | 12.315 V | 11.49 V |
| fill factor | 0.597 | 0.471 |
| short-circuit current | 79.34 mA | 53.7 mA |
| efficiency | 8.33% | 4.43% |

Compared with the figures obtained with the initial embodiment, it is seen that the device having undergone the reverse bias voltage demonstrates further improvement in characteristics. The reason why the reverse bias curing is effective is considered that a chemical reaction between the resin and the semiconductor may produce a stable insulator tightly joined to the pin-holes.

A further embodiment of the invention is shown in FIG. 7. In this embodiment, the process is similar to that of the preceding embodiment. Thus only different configurations are described and a redundant explanation is not given.

Figure 7A:
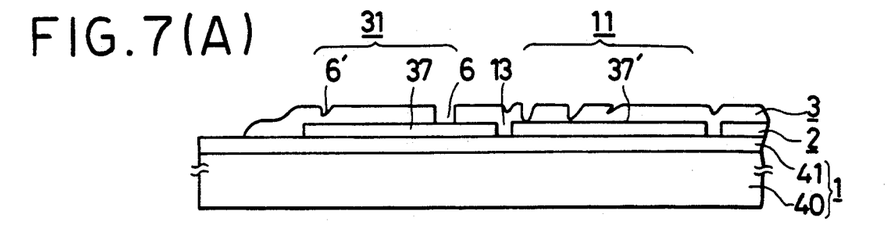
FIGS. 7(A) through 7(D) are fragmentary, cross-sectional views showing a further embodiment of the invention.
Figure 7B:
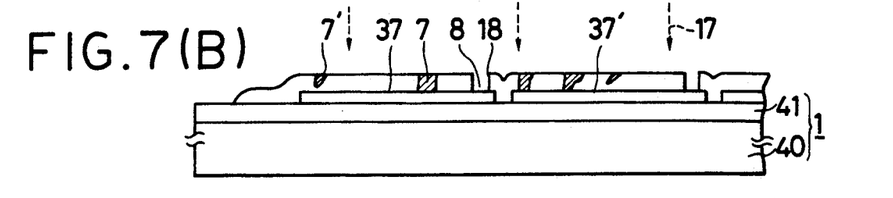

A substrate 1 composed of a conductive stainless steel foil 40 of 10 to 100 micrometers thickness is coated with a heat resistant organic resin film or an inorganic insulator film such as of enamel 41. On the substrate 1, a first electrode 2 is formed, for example, made of a 200 angstroms thick chromium layer, a 1500 angstroms thick aluminum layer plus a 500 angstroms thick $Sn_3N_4$ layer, or a 1500 to 2000 angstroms thick transparent conductive layer mainly composed of tin oxide or tin nitride doped with halogen.

On the substrate is formed a multilayered semiconductor with a pn junction or pin junction composed, for example, of an n-type semiconductor layer 200 to 500 angstroms thick, an intrinsic amorphous or semiamorphous silicon semiconductor layer 0.4 to 0.9 micrometers thick, and a p-type semiconductor layer ($Si_xC_{1-x}$ where $0<x<1$) 50 to 150 angstroms thick.

Figure 7C:
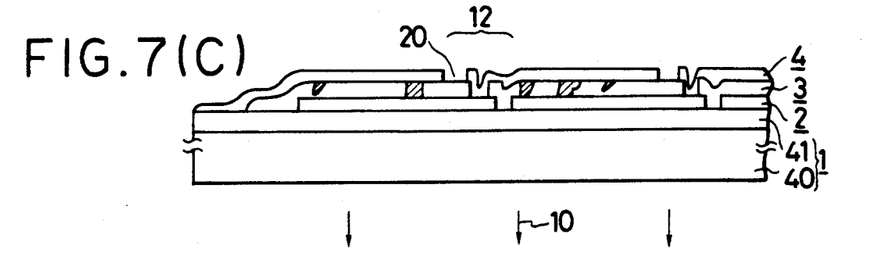
Figure 7D:
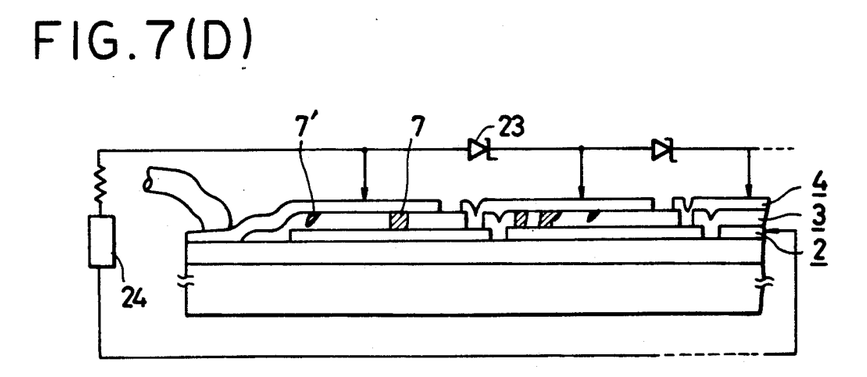

Then, after the stopping process is carried out, a second electrode 300 to 1400 angstroms thick is formed with a metallic mask. The second electrode is made of a conductive transparent material such as ITO, $In_2O_3$, $SnO_2$ or ITN (a mixture of indium nitride and tin nitride).

Grooves 8 which provide accesses to the first electrode reach only to the surface of the first electrode 2, whereby the second electrode of cell 11 can be in contact with the first electrode 2 of cell 31.

After removing the bias applying circuit, the device integrated on a 10 cm × 10 cm panel was irradiated with light of 100 mW/cm$^2$ (AM1). The characteristics obtained were:
  open-circuit voltage: 12.618 V
  fill factor: 0.678
  short-circuit current: 79.710 mA
  current density: 17.371 mA/cm$^2$
  efficiency: 9.82%

With the devices fabricated according to the process identical to that shown in FIG. 7 but without reverse bias curing, the following experimental data 1 were obtained, and without the hole stopping process and reverse bias curing, the following experimental data 2 were obtained:

|  | data 1 | data 2 |
| --- | --- | --- |
| open-circuit voltage | 11.30 V | 6.54 V |
| fill factor | 0.626 | 0.368 |
| short-circuit current | 79.4 mA | 75.69 mA |
| efficiency | 8.16% | 3.48% |

As in the above cases, only by stopping defects of the semiconductor layer is the performance of the photovoltaic device markedly improved, the efficiency versus time being plotted in FIG. 3 and indicated in reference numeral 27.

The other important feature of the invention is not illustrated in the figure, namely, that high yield can be obtained since the fluctuation of the characteristics is small among products. For instance, 0.195 (§9.63%) was obtained as a variance of efficiency from ten samples of 10 cm long × 10 cm wide prepared according to NEDO standard.

While the present invention has been described with reference to several preferred process and embodiments thereof, many variations and modifications will now occur to those skilled in the art. It is our intent, therefore, to be limited solely by the scope of the appending claims and not by the specific embodiments disclosed herein. Examples of variation are as follows.

The semiconductor layer may be constituted by a multijunction structure in place of the single junction structure. Namely, the layer can be a laminate composed of a p-type semiconductor ($Si_xC_{1-x}$), an intrinsic amorphous silicon semiconductor, an n-type silicon semiconductor, a p-type semiconductor ($Si_xC_{1-x}$), an intrinsic semiconductor ($Si_xGe_{1-x}$), and an n-type silicon semiconductor layer 300 to 1000 angstroms thick, wherein $0<X<1$, e.g., $X=0.5$.

To engrave the grooves, all of the grooves can be formed at once by irradiating with a laser beam extending in the lateral direction which is produced from an eximer laser through a cylindrical lens, if necessary, after expansion of the original beam.

The above technique according to the invention is applicable also to a light emitting semiconductor device with double heterojunctions and a superlattice structure. As such devices, the applicant has disclosed some semiconductor devices in U.S. Pat. Nos. 4,527,179 and 4,616,244.

The invention is advantageous also when applied to a diode array of an image sensor or a nonlinear element of a thin film display. In some applications, the reverse bias voltage circuit can be dispensed with or very simplified.

For example, an active device can be cured by applying a reverse voltage to source, drain and/or electrodes.

What is claimed is:

1. A method of producing a solar cell consisting of a plurality of photoconversion devices which are connected in series with each other, each device consisting of a lower electrode, an upper electrode and a photosensitive layer sandwiched therebetween, said method comprising the steps of:

forming a lower electrode pattern on a substrate to provide a lower electrode for each device;

forming a photosensitive semiconductor layer on said substrate over said lower electrode pattern;

filling defects occurring in said semiconductor layer with an insulating material;

patterning said semiconductor layer by means of laser scribing to form grooves through said semiconductor layer in order to provide access to said lower electrode pattern;

removing residue of the laser scribing by etching with an etchant;

rinsing the etchant to remove it from the patterned semiconductor layer; and forming an upper electrode pattern on said patterned semiconductor layer in order to provide an upper electrode of each photoelectric conversion device comprising said upper electrode, said lower electrode and the semiconductor layer located therebetween.

2. The method of claim 1 wherein said etchant is an acid.

3. The method of claim 2 wherein said acid is HF solution.

* * * * *